(12) United States Patent
Park et al.

(10) Patent No.: US 11,441,220 B2
(45) Date of Patent: Sep. 13, 2022

(54) DEPOSITION APPARATUS

(71) Applicant: Samsung Display Co., Ltd., Yongin-si (KR)

(72) Inventors: Kookchol Park, Hwaseong-si (KR); Suhyun Oh, Suwon-si (KR); Sokwon Noh, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 45 days.

(21) Appl. No.: 17/010,535

(22) Filed: Sep. 2, 2020

(65) Prior Publication Data

US 2021/0062322 A1     Mar. 4, 2021

(30) Foreign Application Priority Data

Sep. 3, 2019    (KR) .................. 10-2019-0108846

(51) Int. Cl.
*C23C 14/24*      (2006.01)
*H01L 33/00*      (2010.01)
*H01L 51/56*      (2006.01)

(52) U.S. Cl.
CPC ............ *C23C 14/24* (2013.01); *C23C 14/243* (2013.01); *H01L 33/005* (2013.01); *H01L 51/56* (2013.01)

(58) Field of Classification Search
CPC .................................................. C23C 14/243
See application file for complete search history.

(56) References Cited

U.S. PATENT DOCUMENTS

| | | | | |
|---|---|---|---|---|
| 9,150,952 | B2 | 10/2015 | Lee et al. | |
| 9,227,203 | B2 | 1/2016 | Lee | |
| 9,748,483 | B2 | 8/2017 | Choi et al. | |
| 2002/0179013 | A1* | 12/2002 | Kido | ............... C23C 14/568 118/726 |
| 2005/0005857 | A1* | 1/2005 | Kido | ............... C23C 14/24 118/726 |
| 2011/0146575 | A1* | 6/2011 | Choi | ............... H01L 51/0008 118/721 |
| 2012/0141674 | A1 | 6/2012 | Park et al. | |
| 2013/0186330 | A1 | 7/2013 | Lee et al. | |
| 2014/0008456 | A1 | 1/2014 | Lee | |
| 2014/0315342 | A1* | 10/2014 | Edura | ............... C23C 14/243 438/46 |

(Continued)

FOREIGN PATENT DOCUMENTS

| | | |
|---|---|---|
| EP | 2476774 A1 | 7/2012 |
| JP | 2015-10257 A | 1/2015 |

(Continued)

OTHER PUBLICATIONS

EPO Extended Search Report dated Oct. 14, 2020, issued in corresponding European Patent Application No. 20193789.3 (7 pages).

*Primary Examiner* — Keath T Chen
(74) *Attorney, Agent, or Firm* — Lewis Roca Rothgerber Christie LLP

(57) ABSTRACT

A deposition apparatus may include a chamber, a crucible in the chamber, a cover part covering the crucible, and 2n nozzles (where 'n' is a positive integer number) protruding from the cover part and arranged in a first direction. Among the 2n nozzles, a distance between a n-th nozzle and a (n+1)-th nozzle may be greater than a distance between a (2n−1)-th nozzle and a 2n-th nozzle.

20 Claims, 8 Drawing Sheets

(56) References Cited

U.S. PATENT DOCUMENTS

| | | | | |
|---|---|---|---|---|
| 2016/0201195 A1* | 7/2016 | Lee | ............... | C23C 14/243 |
| | | | | 239/132 |
| 2016/0214133 A1* | 7/2016 | Kim | ............ | H01L 51/0008 |
| 2019/0226090 A1* | 7/2019 | Lopp | ............. | C23C 14/562 |
| 2020/0087777 A1* | 3/2020 | Nishiguchi | ......... | H01L 51/0011 |

FOREIGN PATENT DOCUMENTS

| | | |
|---|---|---|
| KR | 10-2012-0086865 A | 8/2012 |
| KR | 10-1182265 B1 | 9/2012 |
| KR | 10-2013-0010730 A | 1/2013 |
| KR | 10-1240426 B1 | 3/2013 |
| KR | 10-1240945 B1 | 3/2013 |
| KR | 10-2014-0045809 A | 4/2014 |
| KR | 10-2016-0087985 A | 7/2016 |
| KR | 10-1760897 B1 | 7/2017 |
| KR | 10-2019-0014268 A | 2/2019 |
| KR | 10-2020-0029670 A | 3/2020 |
| WO | 2018/054472 A1 | 3/2018 |

\* cited by examiner

DEPOSITION APPARATUS

CROSS-REFERENCE TO RELATED APPLICATION

This application claims priority to and the benefit of Korean Patent Application No. 10-2019-0108846, filed on Sep. 3, 2019, the entire content of which is hereby incorporated by reference.

BACKGROUND

1. Field

The present disclosure herein relates to a deposition apparatus, and more particularly, to a deposition apparatus with improved uniformity of deposition.

2. Description of the Related Art

A display device may include a plurality of pixels. Each of the plurality of pixels may include an emission layer (or a light emitting layer) disposed between opposite electrodes. The electrodes and the emission layer may be formed by various suitable methods, and one of the various suitable methods may be a vacuum deposition method that deposits a set or predetermined material in a vacuum environment to form a thin layer. In the vacuum deposition method, a mask assembly may be disposed between a source unit and a target substrate in a chamber, and a material of the source unit may be sublimated or evaporated to be deposited on the target substrate.

SUMMARY

Aspects of embodiments of the present disclosure are directed toward a deposition apparatus capable of improving uniformity of deposition.

In an embodiment of the present disclosure, a deposition apparatus may include a chamber, a crucible in the chamber, a cover part covering the crucible, and 2n nozzles (where 'n' is a positive integer number) protruding from the cover part and arranged in a first direction. Among the 2n nozzles, a distance between a n-th nozzle and a (n+1)-th nozzle may be greater than a distance between a (2n−1)-th nozzle and a 2n-th nozzle.

In an embodiment, each of the 2n nozzles may include an inlet defined in the same plane as a bottom surface of the cover part, an outlet overlapping a portion of the inlet, and an opening connecting the inlet to the outlet. The outlet may be greater in area than the inlet.

In an embodiment, the opening may include a first opening extending from the inlet in an extending direction, and a second opening extending from the first opening to the outlet in the extending direction. The first opening in a direction perpendicular to the extending direction may be constant in breadth throughout the first opening along the extending direction, and the second opening in the direction perpendicular to the extending direction may have breadth that becomes progressively greater toward the outlet along the extending direction.

In an embodiment, the first opening in the extending direction may be equal to in length to the second opening in the extending direction.

In an embodiment, the lengths of the first and second openings may each be 16 mm.

In an embodiment, a maximum breadth of the second opening may be 2.3 times the breadth of the first opening.

In an embodiment, the breadth of the first opening may be 9.5 mm, and a maximum breadth of the second opening may be 22 mm.

In an embodiment, the cover part may include a top surface parallel to both the first direction and a second direction crossing the first direction, and each of the 2n nozzles may be inclined with respect to a third direction perpendicular to the top surface.

In an embodiment, a first angle between a straight line parallel to the third direction and the (n+1)-th nozzle may be less than a second angle between the straight line parallel to the third direction and the 2n-th nozzle.

In an embodiment, the first angle may be 5 degrees, and the second angle may be 20 degrees.

In an embodiment, the 2n nozzles may include first nozzles inclined at a first angle with respect to a vertical line perpendicular to a top surface of the cover part, second nozzles inclined at a second angle greater than the first angle with respect to the vertical line, third nozzles inclined at a third angle greater than the second angle with respect to the vertical line, fourth nozzles inclined at a fourth angle greater than the third angle with respect to the vertical line, and fifth nozzles inclined at a fifth angle greater than the fourth angle with respect to the vertical line.

In an embodiment, the fifth nozzles may be more in number than the first nozzles, more in number than the second nozzles, more in number than the third nozzles, and more in number than the fourth nozzles.

In an embodiment, the third nozzles may be more in number than the first nozzles, more in number than the second nozzles, and more in number than the fourth nozzles and may be less in number than the fifth nozzles.

In an embodiment, among distances, each of which is a distance between adjacent two of the 2n nozzles, the distance between adjacent two of the fourth nozzles may be the greatest.

In an embodiment, the first nozzles, the second nozzles, the third nozzles, the fourth nozzles and the fifth nozzles may be sequentially arranged in a direction away from a center of the cover part. The n-th nozzle and the (n+1)-th nozzle may be the first nozzles, and a 1st nozzle among the 2n nozzles and the 2n-th nozzle may be the fifth nozzles.

In an embodiment, the deposition apparatus may further include angle limiting parts each having a length extending in the first direction and spaced apart from each other with the 2n nozzles interposed therebetween.

In an embodiment of the present disclosure, a deposition apparatus may include a chamber, a crucible in the chamber, a cover part covering the crucible and including a top surface parallel to both a first direction and a second direction crossing the first direction, and a plurality of nozzles protruding from the cover part and arranged with each other in the first direction. A distance between adjacent two of the plurality of nozzles may be varied depending on a position, and each of the nozzles may be inclined with respect to a third direction perpendicular to the top surface.

In an embodiment, the plurality of nozzles may be 2n in number, where 'n' is a positive integer number. Among the nozzles, a distance between a n-th nozzle and a (n+1)-th nozzle which are in a central area of the cover part may be greater than a distance between a (2n−1)-th nozzle and a 2n-th nozzle which are in an outer area of the cover part.

In an embodiment, the plurality of nozzles may be 2n in number, where 'n' is a positive integer number. Among the 2n nozzles, a distance between a n-th nozzle and a (n+1)-th nozzle which are in a central area of the cover part may be greater than a distance between a (2n−1)-th nozzle and a 2n-th nozzle which are in an outer area of the cover part.

In an embodiment, each of the plurality of nozzles may include an inlet defined in the same plane as a bottom surface of the cover part, an outlet overlapping a portion of the inlet and being greater in area than the inlet, and an opening connecting the inlet to the outlet. The opening may include a first opening extending from the inlet in an extending direction, and a second opening extending from the first opening to the outlet in the extending direction. The first opening in a direction perpendicular to the extending direction may be constant in breadth throughout the first opening along the extending direction, and the second opening in the direction perpendicular to the extending direction may have breadth that becomes progressively greater toward the outlet along the extending direction.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
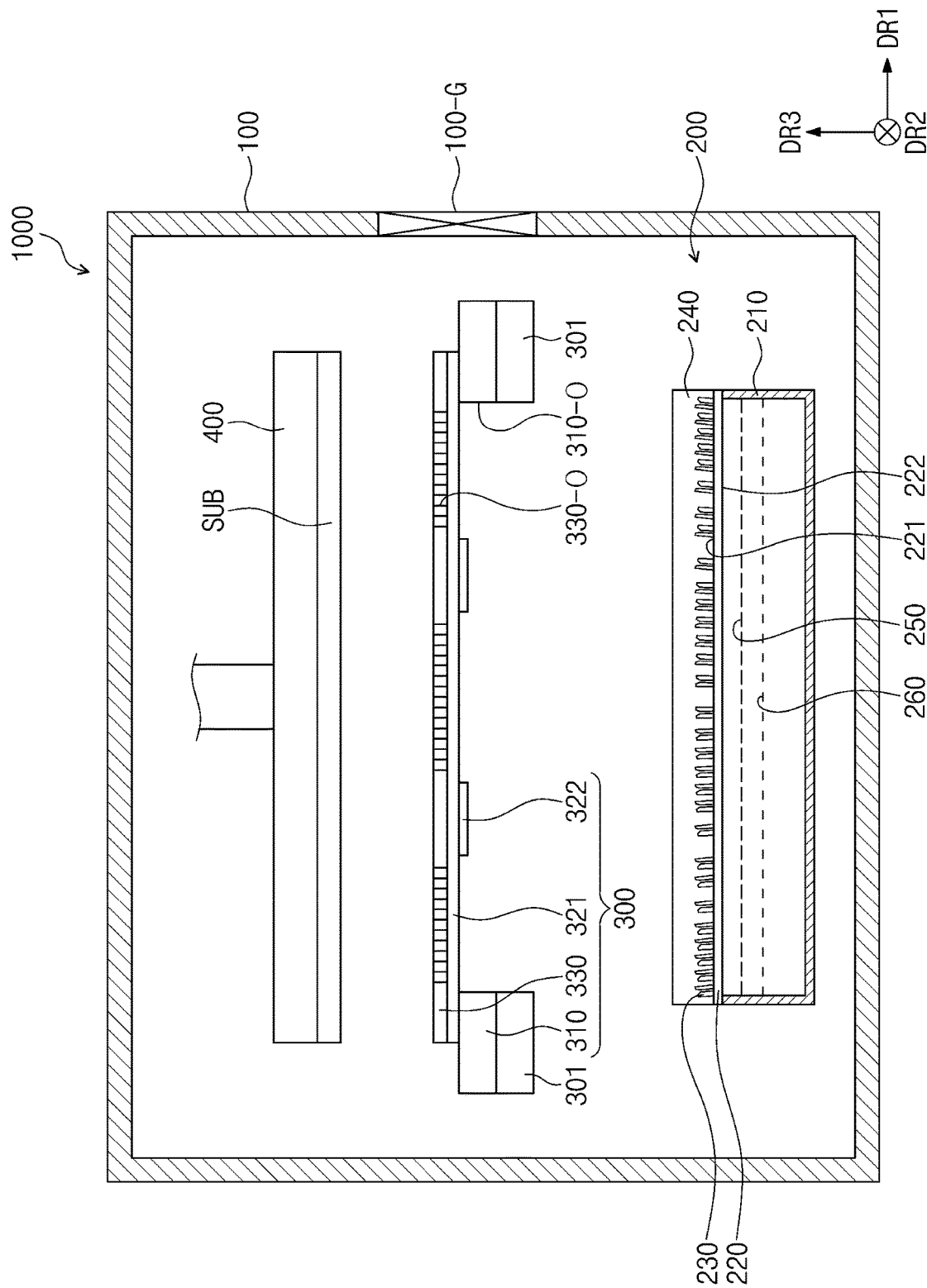
FIG. 1 is a cross-sectional view illustrating a deposition apparatus according to an embodiment of the present disclosure.

The present disclosure now will be described more fully hereinafter with reference to the accompanying drawings, in which various embodiments are shown. The present disclosure may, however, be embodied in many different forms, and should not be construed as limited to the embodiments set forth herein. Rather, these embodiments are provided so that this disclosure will be thorough and complete, and will fully convey the scope of the present disclosure to those skilled in the art. Like reference numerals refer to like elements throughout.

It will be understood that when an element such as a layer, region or substrate is referred to as being "on" another element, it can be directly on the other element or intervening elements may be present. In contrast, the term "directly" (e.g., "directly on") means that there are no intervening elements. As used herein, the term "and/or" includes any and all combinations of one or more of the associated listed items.

The terminology used herein is for the purpose of describing particular embodiments only and is not intended to be limiting. As used herein, the singular forms "a," "an," and "the" are intended to include the plural forms, including "at least one," unless the content clearly indicates otherwise. As used herein, the term "and/or" includes any and all combinations of one or more of the associated listed items. It will be further understood that the terms "comprises," "comprising," "includes," and "including," when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein should be interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings herein.

"About" and "approximately," as used herein, is inclusive of the stated value and means within an acceptable range of deviation for the particular value as determined by one of ordinary skill in the art, considering the measurement in question and the error associated with measurement of the particular quantity (e.g., the limitations of the measurement system).

Example embodiments are described herein with reference to cross-sectional illustrations and/or plane illustrations that are example illustrations. In the drawings, the thicknesses of layers and regions may be exaggerated for clarity. Accordingly, variations from the shapes of the illustrations (e.g., variations from the dimensions of components illustrated in the figures) as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes may not illustrate the actual shape of a region of a device and are not intended to limit the scope of example embodiments.

Hereinafter, example embodiments of the present disclosure will be described in detail with reference to the accompanying drawings.

FIG. 1 is a cross-sectional view illustrating a deposition apparatus according to an embodiment of the present disclosure.

Referring to FIG. 1, a deposition apparatus 1000 may include a chamber 100, a source unit 200, a mask assembly 300, and a movement plate 400.

The chamber 100 may provide an enclosed or sealed space. The source unit 200, the mask assembly 300 and the movement plate 400 may be disposed in the chamber 100. The chamber 100 may have at least one gate 100-G. The chamber 100 may be opened/closed (e.g., opened or closed) by the gate 100-G. A target substrate SUB may enter and leave the chamber 100 through the gate 100-G of the chamber 100.

The source unit 200 may be linearly movable in the chamber 100. For example, the source unit 200 may be moveable in the chamber 100 along a set or predetermined direction (e.g., along a first direction DR1 and/or along a second direction DR2). When the source unit 200 is linearly movable, a linear driving unit to linearly move the source unit 200 may further be provided in the chamber 100. For example, the linear driving unit may include a linear motor or cylinder connected to the source unit 200.

The source unit 200 may include a crucible 210, a cover part 220, a plurality of nozzles 230, an angle limiting member 240, a first inner plate 250, and a second inner plate 260.

The crucible 210 may contain a deposition material. The deposition material may include (e.g., be) a material (e.g., at least one selected from an inorganic material, a metal, and an organic material) capable of being sublimated or evaporated. For example, the deposition material may include (e.g., be) an organic material to form an organic light emitting element.

The cover part 220 may cover the crucible 210. For example, the cover part 220 may cover an opened top end of the crucible 210. The cover part 220 may have a top surface 221 and a bottom surface 222 which are parallel to both the first direction DR1 and the second direction DR2 crossing or intersecting the first direction DR1. The top surface 221 and the bottom surface 222 may be opposite to (e.g., may face oppositely away from) each other.

The nozzles 230 may protrude from the cover part 220 and may be arranged in the first direction DR1. For example, the nozzles 230 may protrude from the top surface 221 of the cover part 220 in a direction away from the crucible 210 (e.g., in a third direction DR3). The nozzles 230 and the cover part 220 may constitute a single unitary body. The deposition material contained in the crucible 210 may be discharged or provided to the outside (e.g., to outside the crucible 210) through the nozzles 230.

The number of the nozzles 230 may be 2n. Here, 'n' may be a positive integral number (e.g., a positive integer number). In one embodiment, an even number of the nozzles 230 may be provided. In FIG. 1, 30 nozzles 230 are illustrated as an example. However, embodiments of the present disclosure are not limited thereto. In certain embodiments, the number of the nozzles 230 may be less than 30 or may be more than 30.

The angle limiting member 240 may be provided adjacent to the nozzles 230. The angle limiting member 240 may limit a discharge path of the deposition material. For example, when the nozzles 230 are arranged in the first direction DR1, the angle limiting member 240 may extend in the first direction DR1. For example, the nozzles 230 may be arranged with each other in a line in the first direction DR1 and the angle limiting member 240 may be at one or more sides of the line of nozzles 230, may extend in the first direction DR1, and may protrude in a direction away from the crucible 210 (e.g., in the third direction DR3). In another embodiment, the angle limiting member 240 may not be provided.

The first inner plate 250 and the second inner plate 260 may be disposed in the crucible 210. The first inner plate 250 may be disposed between the cover part 220 and the second inner plate 260. The first inner plate 250 and the second inner plate 260 may prevent or block the deposition material from overflowing by pumping. In addition, the first inner plate 250 and the second inner plate 260 may block a material which may fall toward a bottom surface of the crucible 210 through the nozzles 230.

A stage 301 may be disposed above the source unit 200. The mask assembly 300 may be placed on the stage 301. The mask assembly 300 may face the source unit 200.

The mask assembly 300 may include a frame 310, support parts 321 and 322, and a mask 330.

The frame 310 may have a ring or loop shape when viewed in a plan view. In one embodiment, a frame opening 310-O may be provided in an area, including a center, of the frame 310. The frame opening 310-O may be a hole penetrating the frame 310 from a top surface of the frame 310 to a bottom surface of the frame 310.

The support parts 321 and 322 may be disposed on the frame 310. The support parts 321 and 322 may overlap with at least a portion of the frame opening 310-O of the frame 310. The support parts 321 and 322 may divide the frame opening 310-O into a plurality of areas. The support parts 321 and 322 may include a first support part 321 and a second support part 322. The first support part 321 may have a length that extends in the first direction DR1. The second support part 322 may have a length that extends in the second direction DR2.

The first and second support parts 321 and 322 may be coupled to the frame 310. For example, the first and second support parts 321 and 322 may be coupled to the frame 310 by weld(s) via a welding method. However, embodiments of the present disclosure are not limited thereto. In another embodiment, the first and second support parts 321 and 322 may be coupled to the frame 310 by a coupling member, and the coupling member may include (e.g., be) a material having adhesive property. In still another embodiment, recesses may be provided at the top surface of the frame 310. The recesses may be concave from the top surface of the frame 310, and suitable portions of the first and second support parts 321 and 322 may be inserted in the recesses. In one embodiment, the first and second support parts 321 and 322 may be engaged with the frame 310. In yet another embodiment, at least one of the first and second support parts 321 and 322 may not be provided.

The mask 330 may be disposed on the first and second support parts 321 and 322. The mask 330 may be provided in singular or may be provided in plural. A plurality of opening patterns 330-O may be defined in the mask 330. The plurality of opening patterns 330-O may not overlap with the first and second support parts 321 and 322 and may overlap with the frame opening 310-O, when viewed in a plan view. The opening patterns 330-O may be through-holes penetrating the mask 330 from a top surface of the mask 330 to a bottom surface of the mask 330.

The mask 330 may be coupled to the first and second support parts 321 and 322. For example, the mask 330 may be coupled to the first and second support parts 321 and 322 by weld(s) via a welding method. However, embodiments of the present disclosure are not limited thereto. In another embodiment, the mask 330 may be coupled to the first and second support parts 321 and 322 by a coupling member (e.g., an adhesive and/or glue).

The movement plate 400 may align the target substrate SUB on or with the mask assembly 300. For example, the movement plate 400 may generate electrostatic force and/or magnetic force to hold the target substrate SUB (e.g., to control the movement and position of the target substrate SUB) and may move the target substrate SUB onto or in alignment with the mask assembly 300. The movement plate 400 may be movable up and down or right and left (e.g., may be moveable in the third direction DR3 or in the first direction DR1).

Figure 2:
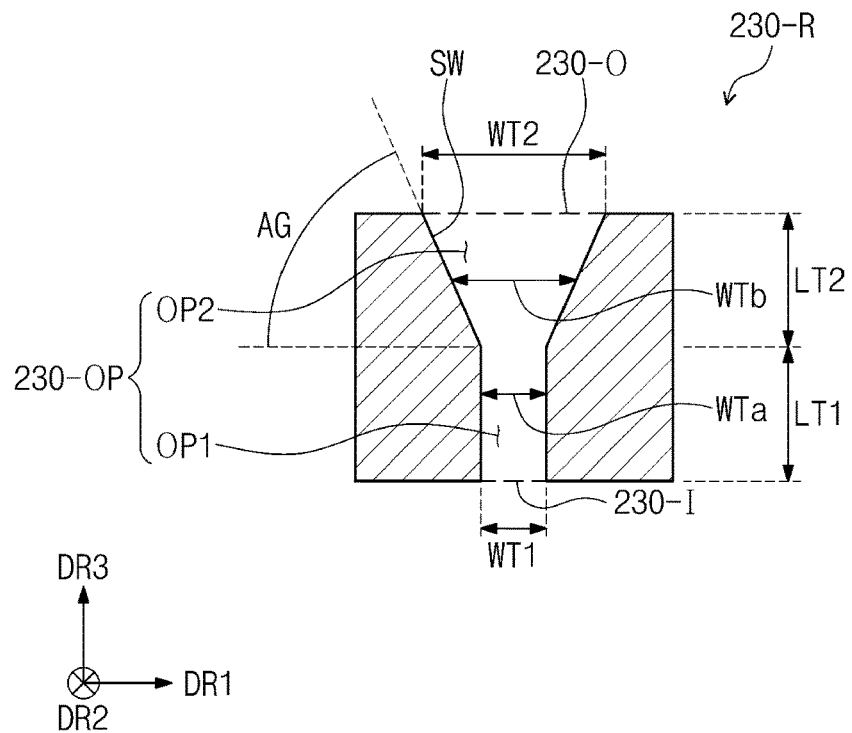
FIG. 2 is a cross-sectional view illustrating a nozzle according to an embodiment of the present disclosure.

FIG. 2 is a cross-sectional view illustrating a nozzle according to an embodiment of the present disclosure. A nozzle 230-R extending in a third direction DR3 perpendicular to the top surface 221 (see FIG. 1) of the cover part 220 (see FIG. 1) is illustrated as an example in FIG. 2.

Referring to FIGS. 1 and 2, the nozzle 230-R may include an inlet 230-I, an outlet 230-O, and an opening 230-OP. The inlet 230-I may be defined in the same plane as the bottom surface 222 of the cover part 220. The outlet 230-O may face (e.g., overlap) the inlet 230-I. The opening 230-OP may connect the inlet 230-I to the outlet 230-O. The deposition material may be discharged or provided to the outside through the inlet 230-I, the opening 230-OP, and the outlet 230-O.

An area of the outlet 230-O may be greater than an area of the inlet 230-I (e.g., the outlet 230-O may be greater in area than the inlet 230-I). For example, a diameter WT1 of the inlet 230-I may be less than a diameter WT2 of the outlet 230-O. For example, a ratio of the diameter WT1 of the inlet 230-I to the diameter WT2 of the outlet 230-O may be 1:2.3. For example, when the diameter WT1 of the inlet 230-I is 9.5 mm, the diameter WT2 of the outlet 230-O may be 22 mm. In the context of the present disclosure, a diameter may also mean a width or breadth of the opening.

The opening 230-OP may include a first opening OP1 and a second opening OP2. The first opening OP1 may extend from the inlet 230-I in an extending direction. The second opening OP2 may extend from the first opening OP1 to the outlet 230-O in the extending direction. In the nozzle 230-R illustrated in FIG. 2, the extending direction may be the third direction DR3.

Each of the first and second openings OP1 and OP2 may have a circular shape when viewed in a plan view. A first diameter WTa of the first opening OP1 may be constant. A second diameter WTb of the second opening OP2 may become progressively greater toward the outlet 230-O. The maximum diameter of the second diameter WTb may correspond to the diameter WT2 of the outlet 230-O. Each of the first and second diameters WTa and WTb may be a diameter in a direction perpendicular to the extending direction. For example, in FIG. 2, each of the first and second diameters WTa and WTb may be a diameter in the first direction DR1.

A first length LT1 of the first opening OP1 may be equal to a second length LT2 of the second opening OP2. For example, each of the first and second lengths LT1 and LT2 may be a length in the extending direction. For example, each of the first and second lengths LT1 and LT2 may be 16 mm.

An inclination angle AG of the second opening OP2 may be 68.85 degrees. The inclination angle AG may be an angle between a direction perpendicular to the extending direction and a sidewall defining the second opening OP2. In FIG. 2, the inclination angle AG may be defined as an angle between the first direction DR1 and a sidewall SW defining the second opening OP2.

Figure 3:
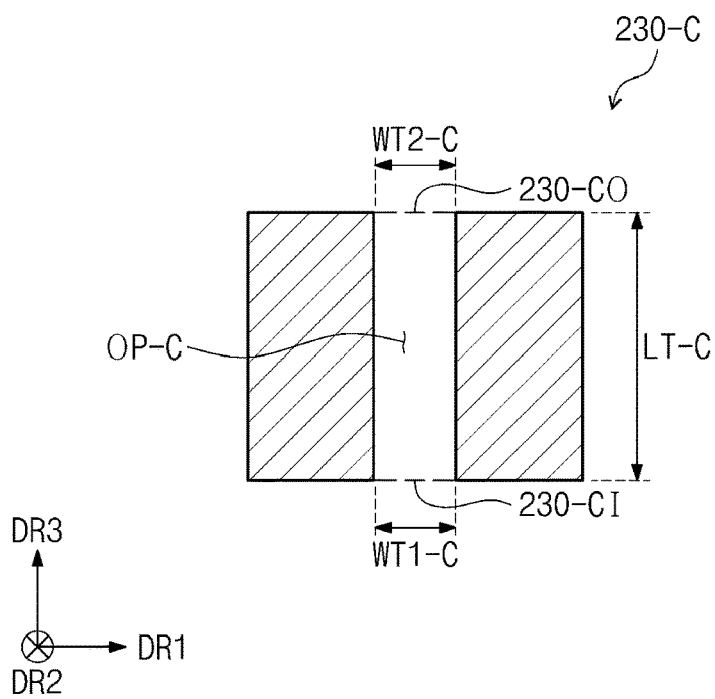
FIG. 3 is a cross-sectional view illustrating a nozzle according to a comparative example of the present disclosure.

FIG. 3 is a cross-sectional view illustrating a nozzle according to a comparative example of the present disclosure.

Referring to FIG. 3, a nozzle 230-C according to a comparative example is illustrated as an example. The nozzle 230-C may include an inlet 230-CI, an outlet 230-CO, and an opening OP-C. An area of the inlet 230-CI may be equal to an area of the outlet 230-CO when viewed in a plan view. For example, a diameter WT1-C of the inlet 230-CI may be equal to a diameter WT2-C of the outlet 230-CO. In addition, a diameter of the opening OP-C may be constant. For example, each of the diameters WT1-C and WT2-C of the inlet 230-CI and the outlet 230-CO, respectively, may be 11.4 mm, and a length LT-C of the opening OP-C may be 32 mm.

Figure 4:
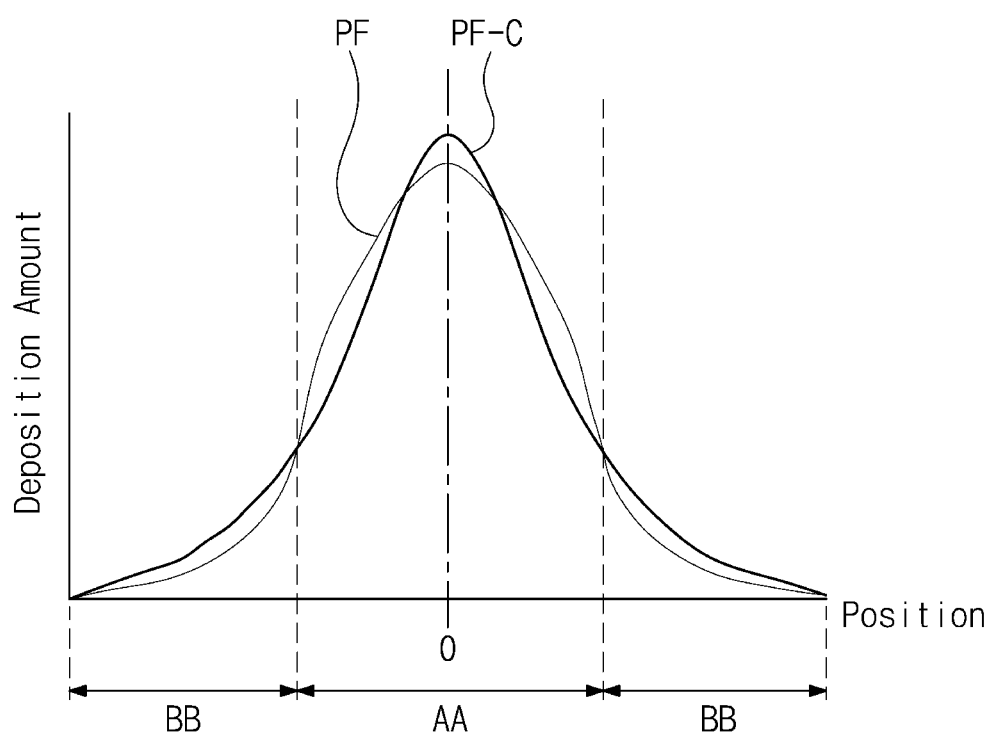
FIG. 4 is a graph showing deposition profiles of layers deposited utilizing nozzles.

FIG. 4 is a graph showing deposition profiles of layers deposited utilizing nozzles.

Referring to FIG. 4, a first profile PF shows a deposition profile of a layer deposited utilizing the nozzle 230-R illustrated in FIG. 2, and a second profile PF-C shows a deposition profile of a layer deposited utilizing the nozzle 230-C illustrated in FIG. 3.

A position of each of the nozzles 230-R and 230-C may correspond to a position '0'. A first area AA may be defined as an effective area, and second areas BB may be defined as non-effective areas. For example, deposition materials provided to the second areas BB may be deposited on the angle limiting member 240 (see FIG. 1). For example, the angle limiting member 240 (see FIG. 1) may prevent or block the deposition material from being deposited in the second areas BB. The amount of the deposition materials provided to the second areas BB may be more in the layer deposited utilizing the nozzle 230-C than in the layer deposited utilizing the nozzle 230-R.

According to an embodiment of the present disclosure, openings having shapes the same as, or similar to, that of the opening 230-OP illustrated in FIG. 2 may be provided in the nozzles 230 illustrated in FIG. 1, respectively. Thus, the amount of the deposition materials deposited on the angle limiting member 240 (see FIG. 1) may be reduced, and the use efficiency of the material (e.g., the deposition material) may be improved.

Figure 5:
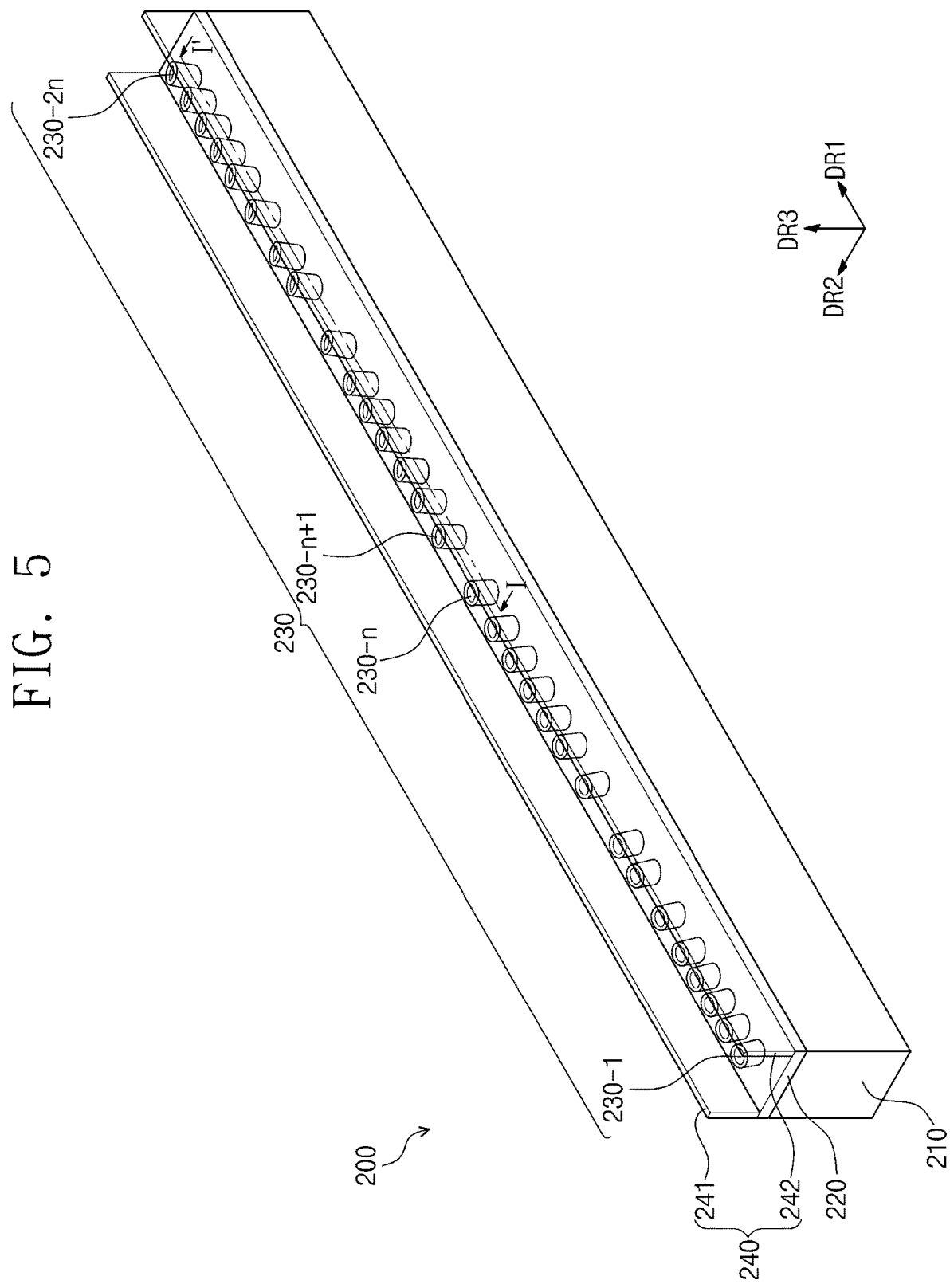
FIG. 5 is a perspective view illustrating a source unit according to an embodiment of the present disclosure.

FIG. 5 is a perspective view illustrating a source unit according to an embodiment of the present disclosure.

Referring to FIG. 5, 2n nozzles 230 may be arranged in the first direction DR1. A $1^{st}$ nozzle 230-1 to a 2n-th nozzle 230-2n may be sequentially arranged in the first direction DR1. A n-th nozzle 230-n and a (n+1)-th nozzle 230-n+1 may be disposed in a central area of the cover part 220. The $1^{st}$ nozzle 230-1 to the n-th nozzle 230-n and the (n+1)-th nozzle 230-n+1 to the 2n-th nozzle 230-2n may be symmetrical (e.g., reflection symmetrical).

The angle limiting member 240 may include a first angle limiting part 241 and a second angle limiting part 242. Each of the first and second angle limiting parts 241 and 242 may extend to have length in the first direction DR1. The first and second angle limiting parts 241 and 242 may be spaced apart from each other in the second direction DR2. The nozzles 230 may be disposed between the first angle limiting part 241 and the second angle limiting part 242.

The deposition materials provided to the second areas BB (see FIG. 4) may be adhered or deposited onto each of the first and second angle limiting parts 241 and 242. The first and second angle limiting parts 241 and 242 may adjust a discharge angle (or radial angle) of the deposition material.

Figure 6:
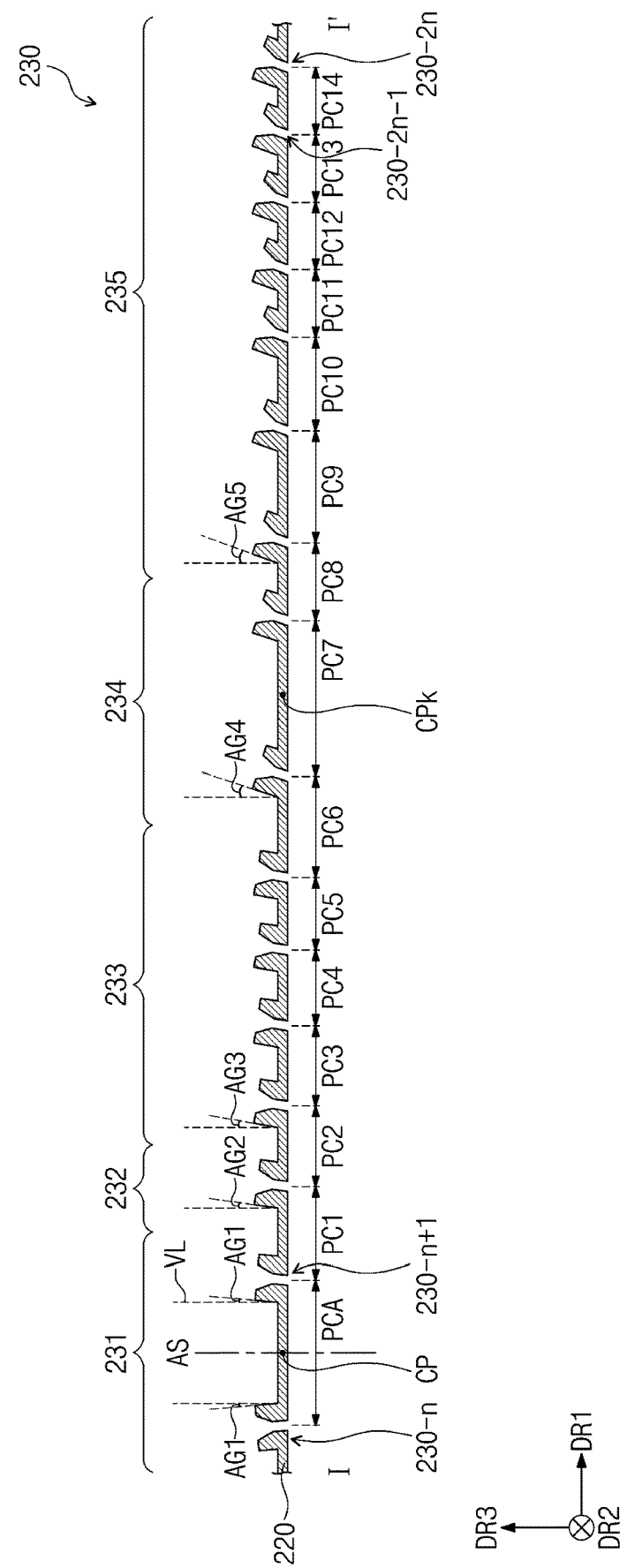
FIG. 6 is a cross-sectional view taken along a line I-I' of FIG. 5.

FIG. 6 is a cross-sectional view taken along a line I-I' of FIG. 5.

Referring to FIG. 6, the n-th nozzle 230-*n* to the 2n-th nozzle 230-2n are illustrated. The n-th nozzle 230-*n* and the (n+1)-th nozzle 230-*n*+1 may be axisymmetric with respect to a symmetry axis AS. The symmetry axis AS may pass through a center CP of the cover part 220 and may extend in the third direction DR3. The 1$^{st}$ nozzle 230-1 (see FIG. 5) and the 2n-th nozzle 230-2n may be axisymmetric.

The nozzles 230 may include first nozzles 231, second nozzles 232, third nozzles 233, fourth nozzles 234, and fifth nozzles 235. The first nozzles 231, the second nozzles 232, the third nozzles 233, the fourth nozzles 234, and the fifth nozzles 235 may be sequentially arranged in a direction away from the center CP of the cover part 220. For example, the n-th nozzle 230-*n* and the (n+1)-th nozzle 230-*n*+1 may be included among (e.g., may be) the first nozzles 231, and the 1$^{st}$ nozzle 230-1 (see FIG. 5) and the 2n-th nozzle 230-2n may be included among (e.g., may be) the fifth nozzles 235.

The first nozzles 231 may be inclined at a first angle AG1 with respect to a vertical line VL perpendicular to the top surface 221 of the cover part 220. The top surface 221 may be parallel to both the first direction DR1 and the second direction DR2. Thus, the vertical line VL may be parallel to the third direction DR3. The second nozzles 232 may be inclined at a second angle AG2 with respect to the vertical line VL. The third nozzles 233 may be inclined at a third angle AG3 with respect to the vertical line VL. The fourth nozzles 234 may be inclined at a fourth angle AG4 with respect to the vertical line VL. The fifth nozzles 235 may be inclined at a fifth angle AG5 with respect to the vertical line VL.

The first to fifth angles AG1, AG2, AG3, AG4 and AG5 may satisfy the following expression 1.

First angle AG1<Second angle AG2<Third angle AG3<Fourth angle AG4<Fifth angle AG5    [Expression 1]

For example, the first angle AG1 may be 5 degrees, the second angle AG2 may be 8 degrees, the third angle AG3 may be 10 degrees, the fourth angle AG4 may be 18 degrees, and the fifth angle AG5 may be 20 degrees.

According to an embodiment of the present disclosure, all of the nozzles 230 may be inclined with respect to the vertical line VL. The angles between the vertical line VL and the inclined nozzles 230 may be adjusted to improve the uniformity of deposition. According to the embodiment of the present disclosure, because the first nozzles 231 adjacent to the center CP of the cover part 220 are inclined at the first angle AG1, it is possible to prevent or block the deposition material from being concentrated to the target substrate facing the center CP (e.g., from being concentrated at a portion of the target substrate SUB aligned with the center CP) of the cover part 220.

In the (n+1)-th nozzle 230-*n*+1 to the 2n-th nozzle 230-2n, one first nozzle 231, one second nozzle 232, four third nozzles 233, two fourth nozzles 234, and seven fifth nozzles 235 may be sequentially arranged in the direction away from the center CP. Because the nozzles 230 are symmetrical with respect to the center CP of the cover part 220, in the 2n nozzles 230, the number of the first nozzles 231 may be 2, the number of the second nozzles 232 may be 2, the number of the third nozzles 233 may be 8, the number of the fourth nozzles 234 may be 4, and the number of the fifth nozzles 235 may be 14.

The numbers of the first to fifth nozzles 231, 232, 233, 234 and 235 may satisfy the following expression 2.

The number of first nozzles 231=The number of second nozzles 232<The number of fourth nozzles 234<The number of third nozzles 233<The number of fifth nozzles 235    [Expression 2]

A distance between adjacent two of the nozzles 230 may be varied depending on positions of the nozzles. A center distance PCA and first to fourteenth distances PC1, PC2, PC3, PC4, PC5, PC6, PC7, PC8, PC9, PC10, PC11, PC12, PC13 and PC14 are illustrated in FIG. 6.

The center distance PCA may be a distance between the n-th nozzle 230-*n* and the (n+1)-th nozzle 230-*n*+1. The fourteenth distance PC14 may be a distance between a (2n−1)-th nozzle 230-2n−1 and the 2n-th nozzle 230-2n. The center distance PCA may be greater than the fourteenth distance PC14.

According to the embodiment of the present disclosure, the distance between the nozzles disposed in a central area of the cover part 220 may be greater than the distance between the nozzles disposed in an outer area of the cover part 220, and thus the uniformity of a thickness of the deposition material deposited on the target substrate may be improved.

A middle point CPk between the (n+1)-th nozzle 230-*n*+1 and the 2n-th nozzle 230-2n may be located between the fourth nozzles 234. In an embodiment of the present disclosure, the seventh distance PC7 between the fourth nozzles 234 may have the greatest value among the center distance PCA and the first to fourteenth distances PC1, PC2, PC3, PC4, PC5, PC6, PC7, PC8, PC9, PC10, PC11, PC12, PC13 and PC14. In one embodiment, in all of the nozzles 230, a distance between two adjacent nozzles respectively located at both sides of each of a ¼ point and a ¾ point of a distance between the 1$^{st}$ nozzle 230-1 and the 2n-th nozzle 230-2n may be the maximum distance between nozzles.

The center distance PCA may be 56 mm, the first distance PC1 may be 36 mm, the second distance PC2 may be 31 mm, and the third distance PC3 may be 31 mm. The fourth distance PC4 may be 29 mm, the fifth distance PC5 may be 28 mm, the sixth distance PC6 may be 39 mm, the seventh distance PC7 may be 60 mm, and the eighth distance PC8 may be 50 mm. The ninth distance PC9 may be 43 mm, and the tenth distance PC10 may be 36 mm. Each of the eleventh to fourteenth distances PC11, PC12, PC13 and PC14 may be 26 mm.

According to the embodiments of the present disclosure, the distances between the nozzles 230 (e.g., between adjacent nozzles 230) and the inclination angles of the nozzles 230 may be adjusted to uniformly deposit the deposition material. In addition, the shapes of the openings 230-OP (see FIG. 2) in the nozzles 230 may be adjusted to improve straightness of the deposition material discharged from the source unit 200 (see FIG. 1). When the straightness is improved, a shadow area of a layer deposited on the target substrate may be reduced, and the amount of the deposition material (see FIG. 4) deposited on the angle limiting member 240 (see FIG. 5) may be reduced to improve the use efficiency of the material (e.g., the deposition material).

Figure 7:
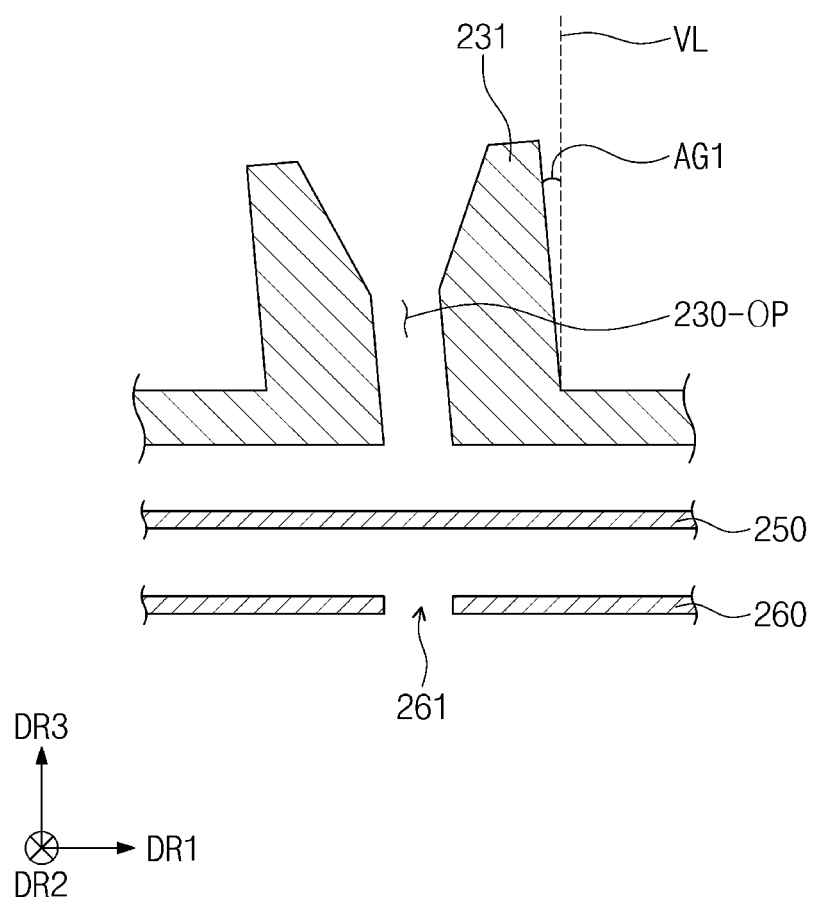
FIG. 7 is a cross-sectional view illustrating the source unit of FIG. 5.
Figure 8:
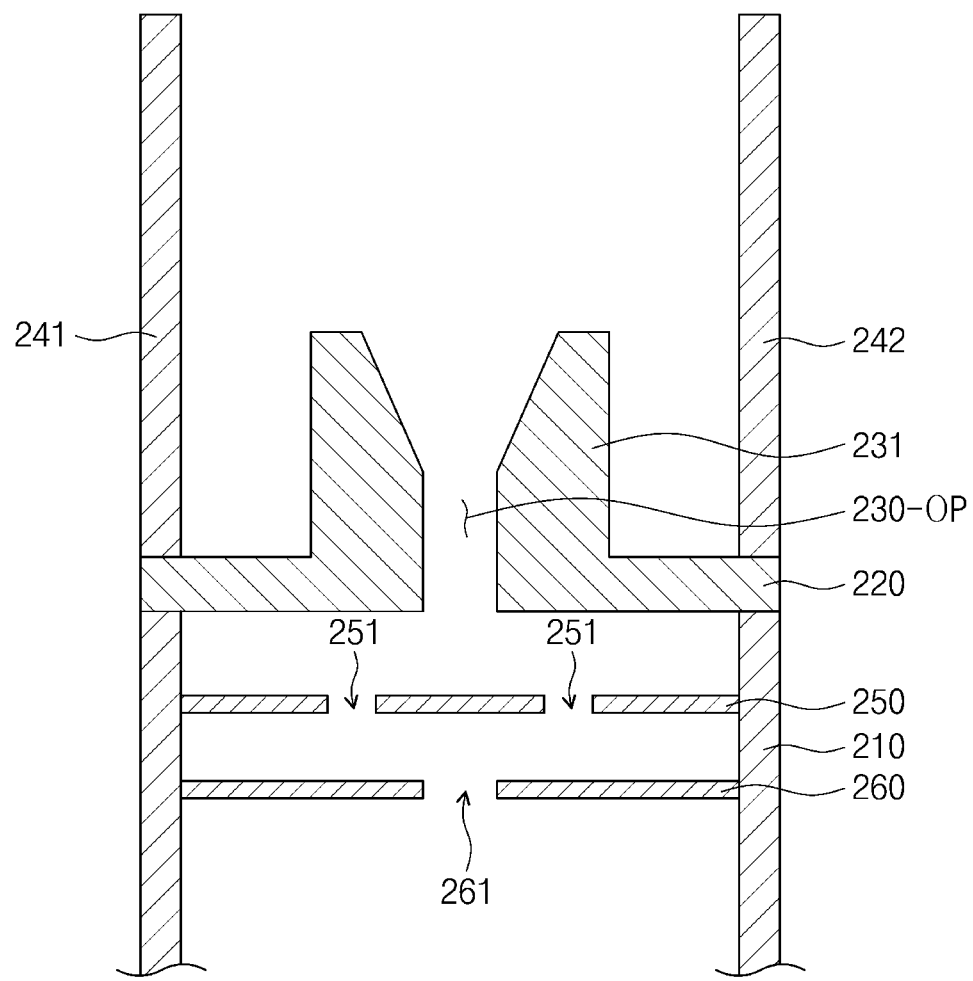
FIG. 8 is a cross-sectional view illustrating the source unit of FIG. 5.
Figure 8:
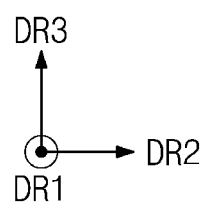

FIG. 7 is a cross-sectional view illustrating the source unit of FIG. 5. FIG. 8 is a cross-sectional view illustrating the source unit of FIG. 5. FIG. 7 is a cross-sectional view illustrating a partial area of the source unit 200 which is parallel to both the first direction DR1 and the third direction DR3, and FIG. 8 is a cross-sectional view illustrating a partial area of the source unit 200 which is parallel to both the second direction DR2 and the third direction DR3. The first nozzle 231 is illustrated as an example in FIGS. 7 and 8.

Referring to FIGS. 7 and 8, the first inner plate 250 and the second inner plate 260 may be sequentially disposed under the opening 230-OP of the first nozzle 231.

First openings 251 may be defined in the first inner plate 250, and second openings 261 may be defined in the second inner plate 260. The first openings 251 may not overlap with the second openings 261 when viewed in a plan view. For example, the first openings 251 may not overlap with the nozzles 230 (e.g., with the openings 230-OP of the nozzles 230), and the second openings 261 may overlap with the nozzles 230 (e.g., with the openings 230-OP of the nozzles 230).

Sizes of the first openings 251 (e.g., areas of the first openings 251 when viewed in a plan view) may be less than sizes of the second openings 261 (e.g., areas of the second openings 261 when viewed in a plan view). For example, a width (or a diameter or breadth) of each of the first openings 251 may be 2.2 mm, and a width (or a diameter or breadth) of each of the second openings 261 may be 5.0 mm.

The number of the first openings 251 may be more than the number of the second openings 261. For example, the number of the first openings 251 may be twice the number of the nozzles 230 (see FIG. 1), and the number of the second openings 261 may be equal to the number of the nozzles 230 (see FIG. 1).

Figure 9:
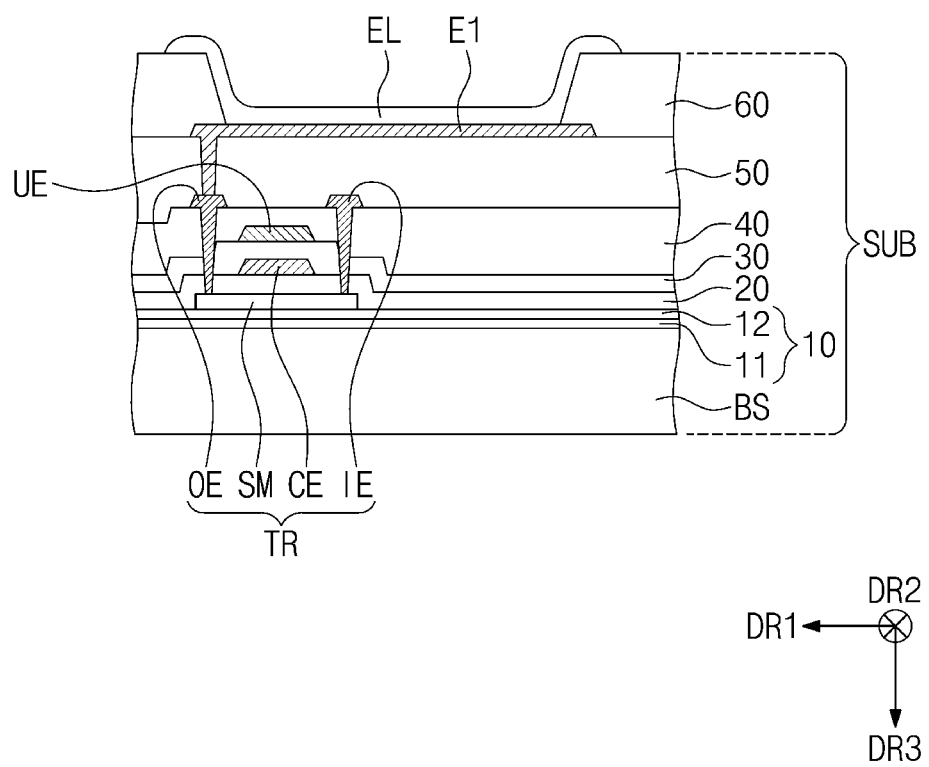
FIG. 9 is a cross-sectional view illustrating a target substrate according to an embodiment of the present disclosure.

FIG. 9 is a cross-sectional view illustrating a target substrate according to an embodiment of the present disclosure.

Referring to FIGS. 1 and 9, the deposition material may be deposited on the target substrate SUB exposed by the opening pattern 330-O of the mask 330. In the deposition process, a distance between the target substrate SUB and the mask 330 may be reduced as compared with the illustration of FIG. 1. For example, the distance between the mask 330 and the target substrate SUB may be reduced to about 3 micrometers.

For example, the target substrate SUB may include a base layer BS, first to sixth insulating layers 10, 20, 30, 40, 50 and 60, a transistor TR, and a first electrode E1.

The base layer BS may be a plastic substrate, a glass substrate, an insulating film, or a stack structure including a plurality of insulating layers.

The first insulating layer 10 may be disposed on the base layer BS. The first insulating layer 10 may include a barrier layer 11 and a buffer layer 12.

The barrier layer 11 may include (e.g., be) an inorganic material. The barrier layer 11 may prevent or block oxygen and/or moisture from permeating or penetrating into pixels through the base layer BS. The buffer layer 12 may include (e.g., be) an inorganic material. The buffer layer 12 may provide surface energy lower than that of the base layer BS to the pixels such that the pixels are stably formed on the base layer BS. In FIG. 9, each of the barrier layer 11 and the buffer layer 12 is illustrated as a single layer. However, embodiments of the present disclosure are not limited thereto. In another embodiment, each of the barrier layer 11 and the buffer layer 12 may be provided in plurality, and the barrier layers 11 and the buffer layers 12 may be alternately stacked. In one embodiment, at least one of the barrier layer 11 or the buffer layer 12 may be provided in plurality or may not be provided.

Each of the pixels may include a pixel circuit and a light emitting element. The pixel circuit may include transistors TR and a capacitor. In FIG. 9, one transistor TR is illustrated as an example.

The transistor TR may be disposed on the first insulating layer 10. The transistor TR may include a semiconductor pattern SM, a control electrode CE, an input electrode IE, and an output electrode OE. The semiconductor pattern SM may be disposed on the first insulating layer 10. The semiconductor pattern SM may include (e.g., be) a semiconductor material. The control electrode CE may be spaced apart from the semiconductor pattern SM with the second insulating layer 20 interposed therebetween.

The input electrode IE and the output electrode OE may penetrate the second, third and fourth insulating layers 20, 30 and 40 so as to be connected to one side portion and another side portion of the semiconductor pattern SM, respectively. The one side portion of the semiconductor pattern SM which is connected to the input electrode IE may be a source, and the other side portion of the semiconductor pattern SM which is connected to the output electrode OE may be a drain. Each of the input electrode IE and the output electrode OE may be referred to as a connecting electrode.

An upper electrode UE may be disposed between the third insulating layer 30 and the fourth insulating layer 40. The upper electrode UE may be connected to an electrode of the capacitor.

The fifth insulating layer 50 may be disposed on the fourth insulating layer 40 to cover the input electrode IE and the output electrode OE.

The first electrode E1 may be disposed on the fifth insulating layer 50. The first electrode E1 may penetrate the fifth insulating layer 50 so as to be electrically connected to the transistor TR.

The sixth insulating layer 60 may be disposed on the fifth insulating layer 50. An opening may be defined in the sixth insulating layer 60, and the opening may expose at least a portion of the first electrode E1. The sixth insulating layer 60 may be a pixel defining layer.

The mask 330 may face the sixth insulating layer 60. The opening pattern 330-O of the mask 330 may overlap with the opening of the sixth insulating layer 60 when viewed in a plan view. The deposition material may pass through the opening pattern 330-O of the mask 330 and then may be deposited on the first electrode E1. For example, an emission layer EL may be formed on the first electrode E1. The deposition material may be a material forming the emission layer EL. In one embodiment, the emission layer EL may be the deposition material deposited on the target substrate SUB.

The emission layer EL may include (e.g., be) a light emitting material. For example, the emission layer EL may include (e.g., be) at least one selected from materials to emit red light, green light and blue light. The emission layer EL may include (e.g., be) a fluorescent material or a phosphorescent material. The emission layer EL may include (e.g., be) an organic light emitting material or an inorganic light emitting material.

According to the embodiments of the present disclosure, the distances between the nozzles and the inclination angles of the nozzles may be adjusted to uniformly deposit the deposition material. In addition, the shapes of the openings defined in the nozzles may be adjusted to improve the straightness of the deposition material discharged from the source unit.

While the present disclosure has been described with reference to example embodiments, it will be apparent to those skilled in the art that various changes and modifications may be made without departing from the spirits and scopes of the present disclosure. Therefore, it should be understood that the above embodiments are not limiting, but illustrative. Thus, the scopes of the present disclosure are to be determined by the broadest permissible interpretation of the following claims and their equivalents, and shall not be restricted or limited by the foregoing description.

What is claimed is:

1. A deposition apparatus comprising:
a chamber;
a crucible in the chamber;
a cover part covering the crucible; and
2n nozzles (where 'n' is a positive integer number greater than 1) protruding from the cover part and arranged in a first direction,
wherein, among the 2n nozzles, a distance between a n-th nozzle and a (n+1)-th nozzle is greater than a distance between a (2n−1)-th nozzle and a 2n-th nozzle,
wherein the 2n nozzles comprise:
one or more first nozzles inclined at a same, fixed first angle with respect to a vertical line perpendicular to a top surface of the cover part;
one or more second nozzles inclined at a same, fixed second angle greater than the first angle with respect to the vertical line; and
a plurality of third nozzles inclined at a same, fixed third angle greater than the second angle with respect to the vertical line, and
wherein the one or more first nozzles, the one or more second nozzles, and the plurality of third nozzles are sequentially arranged with each other in this order from a center of the cover part.

2. The deposition apparatus of claim 1, wherein each of the 2n nozzles comprises:
an inlet defined in a same plane as a bottom surface of the cover part;
an outlet overlapping a portion of the inlet; and
an opening connecting the inlet to the outlet, and
wherein the outlet is greater in area than the inlet.

3. The deposition apparatus of claim 2, wherein the opening includes: a first opening extending from the inlet in an extending direction; and a second opening extending from the first opening to the outlet in the extending direction,
wherein the first opening in a direction perpendicular to the extending direction is constant in breadth throughout the first opening along the extending direction, and
wherein the second opening in the direction perpendicular to the extending direction has breadth that becomes progressively greater toward the outlet along the extending direction.

4. The deposition apparatus of claim 3, wherein the first opening in the extending direction is equal in length to the second opening in the extending direction.

5. The deposition apparatus of claim 4, wherein the lengths of the first and second openings are each 16 mm.

6. The deposition apparatus of claim 3, wherein a maximum breadth of the second opening is 2.3 times the breadth of the first opening.

7. The deposition apparatus of claim 3, wherein the breadth of the first opening is 9.5 mm, and a maximum breadth of the second opening is 22 mm.

8. The deposition apparatus of claim 1, wherein the cover part includes a top surface parallel to both the first direction and a second direction crossing the first direction, and each of the 2n nozzles is inclined with respect to a third direction perpendicular to the top surface.

9. The deposition apparatus of claim 8, wherein an angle between a straight line parallel to the third direction and the (n+1)-th nozzle is less than an angle between the straight line parallel to the third direction and the 2n-th nozzle.

10. The deposition apparatus of claim 9, wherein the angle between the straight line parallel to the third direction and the (n+1)-th nozzle is 5 degrees, and the angle between the straight line parallel to the third direction and the 2n-th nozzle is 20 degrees.

11. The deposition apparatus of claim 1, wherein the 2n nozzles further comprise:
one or more fourth nozzles inclined at a fourth angle greater than the third angle with respect to the vertical line; and
one or more fifth nozzles inclined at a fifth angle greater than the fourth angle with respect to the vertical line.

12. The deposition apparatus of claim 11, wherein the fifth nozzles are more in number than the one or more first nozzles, more in number than the one or more second nozzles, more in number than the plurality of third nozzles, and more in number than the one or more fourth nozzles.

13. The deposition apparatus of claim 12, wherein the plurality of third nozzles are more in number than the one or more first nozzles, more in number than the one or more second nozzles, and more in number than the one or more fourth nozzles, and are less in number than the fifth nozzles.

14. The deposition apparatus of claim 13, wherein, among distances, each of which is a distance between adjacent two of the 2n nozzles, the distance between adjacent two of the fourth nozzles is the greatest.

15. The deposition apparatus of claim 11, wherein the one or more first nozzles, the one or more second nozzles, the plurality of third nozzles, the one or more fourth nozzles and the one or more fifth nozzles are sequentially arranged with each other in this order in a direction away from the center of the cover part,
wherein the one or more first nozzles comprise the (n+1)-th nozzle, and
wherein the one or more fifth nozzles comprise the 2n-th nozzle.

16. The deposition apparatus of claim 1, further comprising:
angle limiting parts each having a length extending in the first direction and spaced apart from each other with the 2n nozzles interposed therebetween.

17. A deposition apparatus comprising:
a chamber;
a crucible in the chamber;
a cover part covering the crucible and including a top surface parallel to both a first direction and a second direction crossing the first direction; and
a plurality of nozzles protruding from the cover part and arranged with each other in the first direction,
wherein a distance between adjacent two of the plurality of nozzles is varied depending on a position, and all of the plurality of nozzles are inclined with respect to a third direction perpendicular to the top surface, and
wherein the plurality of nozzles comprise:
one or more first nozzles inclined at a same, fixed first angle with respect to a straight line parallel to the third direction;
one or more second nozzles inclined at a same, fixed second angle greater than the first angle with respect to the straight line; and
a plurality of third nozzles inclined at a same, fixed third angle greater than the second angle with respect to the straight line, and wherein the one or more first nozzles, the one or more second nozzles, and the plurality of third nozzles are sequentially arranged with each other in this order from a center of the cover part.

18. The deposition apparatus of claim 17, wherein the plurality of nozzles is 2n in number, where 'n' is a positive integer number greater than 1, and wherein, among the 2n nozzles, a distance between a n-th nozzle and a (n+1)-th nozzle which are in a central area of the cover part is greater than a distance between a (2n−1)-th nozzle and a 2n-th nozzle which are in an outer area of the cover part.

19. The deposition apparatus of claim 18, wherein an angle between the straight line parallel to the third direction and the (n+1)-th nozzle is less than an angle between the straight line parallel to the third direction and the 2n-th nozzle.

20. The deposition apparatus of claim 17, wherein each of the plurality of nozzles comprises:

an inlet defined in a same plane as a bottom surface of the cover part;

an outlet overlapping a portion of the inlet and being greater in area than the inlet; and an opening connecting the inlet to the outlet, wherein the opening includes: a first opening extending from the inlet in an extending direction; and a second opening extending from the first opening to the outlet in the extending direction, wherein the first opening in a direction perpendicular to the extending direction is constant in breadth throughout the first opening along the extending direction, and wherein the second opening in the direction perpendicular to the extending direction has breadth that becomes progressively greater toward the outlet along the extending direction.

* * * * *